(12) United States Patent
Platzgummer

(10) Patent No.: US 8,183,543 B2
(45) Date of Patent: May 22, 2012

(54) MULTI-BEAM SOURCE

(75) Inventor: Elmar Platzgummer, Vienna (AT)

(73) Assignee: IMS Nanofabrication AG, Vienna (AT)

( * ) Notice: Subject to any disclaimer, the term of this patent is extended or adjusted under 35 U.S.C. 154(b) by 267 days.

(21) Appl. No.: 12/178,153

(22) Filed: Jul. 23, 2008

(65) Prior Publication Data

US 2009/0026389 A1     Jan. 29, 2009

(30) Foreign Application Priority Data

Jul. 24, 2007 (AT) ................. A 1174/2007

(51) Int. Cl.
  *A61N 5/00* (2006.01)
  *G21G 5/00* (2006.01)
(52) U.S. Cl. ........... 250/492.2; 250/492.21; 250/492.22; 250/396 R; 250/398; 250/492.23; 250/491.1
(58) Field of Classification Search ............... 250/492.2, 250/492.21, 492.22, 396 R, 398, 492.23, 250/491.1
See application file for complete search history.

(56) References Cited

U.S. PATENT DOCUMENTS

| | | | |
|---|---|---|---|
| 5,801,388 A | 9/1998 | Stengl et al. | |
| 6,326,632 B1 | 12/2001 | Buschbeck et al. | |
| 6,768,125 B2 * | 7/2004 | Platzgummer et al. | 250/492.22 |
| 6,989,546 B2 * | 1/2006 | Loschner et al. | 250/492.22 |
| 7,084,411 B2 | 8/2006 | Lammer-Pachlinger et al. | |
| 2004/0232349 A1 | 11/2004 | Kruit | |
| 2005/0161621 A1 | 7/2005 | Wieland et al. | |
| 2005/0211921 A1 | 9/2005 | Wieland et al. | |

FOREIGN PATENT DOCUMENTS

| | | |
|---|---|---|
| EP | 1 139 384 A2 | 10/2001 |
| EP | 1 253 619 A2 | 10/2002 |
| JP | 2002-319532 | 10/2002 |
| JP | 2004-165499 | 6/2004 |
| JP | 2008-218422 | 9/2008 |
| WO | WO 2005/024881 A2 | 3/2005 |
| WO | WO 2006/084298 A1 | 8/2006 |

OTHER PUBLICATIONS

European Search Report for Application No. EP 08450110.5 mailed Dec. 18, 2008.
European Examiner's Report for Application No. EP 08450110.5 mailed Feb. 22, 2010.
Japanese Office Action for Application No. JP 2007-554380 mailed Nov. 22, 2011.

* cited by examiner

*Primary Examiner* — Jack Berman
*Assistant Examiner* — Meenakshi S Sahu
(74) *Attorney, Agent, or Firm* — RatnerPrestia

(57) ABSTRACT

A multi-beam source for generating a plurality of beamlets of energetic electrically charged particles. The multi-beam source includes an illumination system generating an illuminating beam of charged particles and a beam-forming system being arranged after the illumination system as seen in the direction of the beam, adapted to form a plurality of telecentric or homocentric beamlets out of the illuminating beam. The beam forming system includes a beam-splitter and an electrical zone device, the electrical zone having a composite electrode composed of a plurality of substantially planar partial electrodes, adapted to be applied different electrostatic potentials and thus influencing the beamlets.

45 Claims, 7 Drawing Sheets

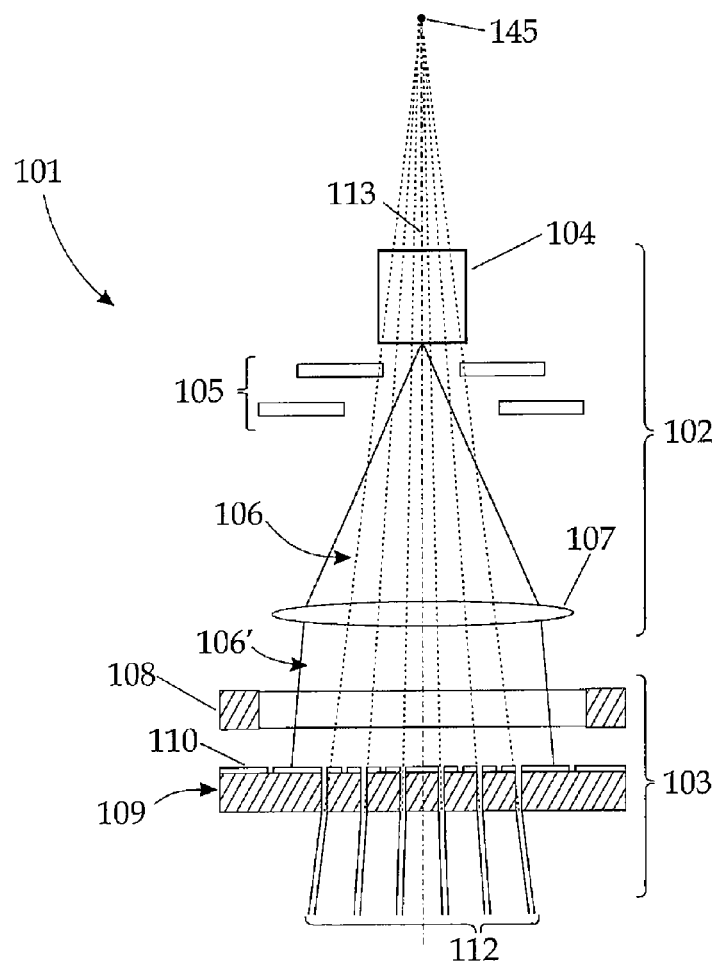
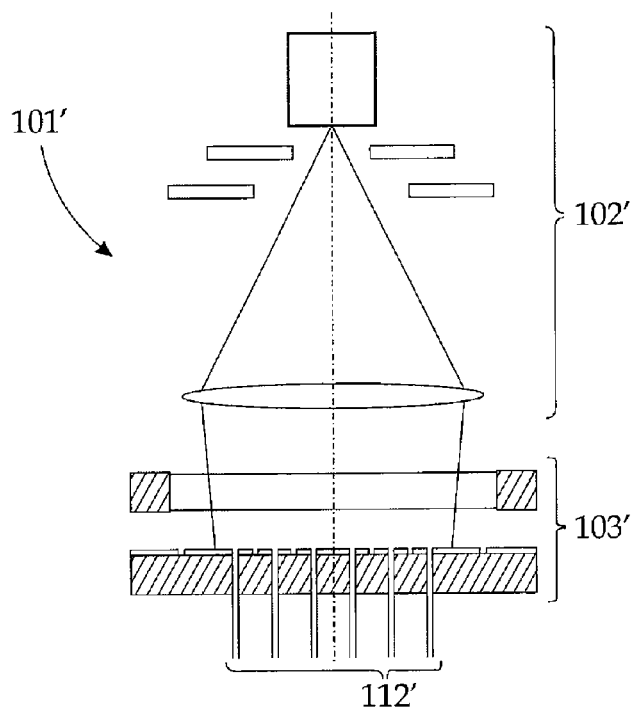
Fig. 1
Fig. 1a

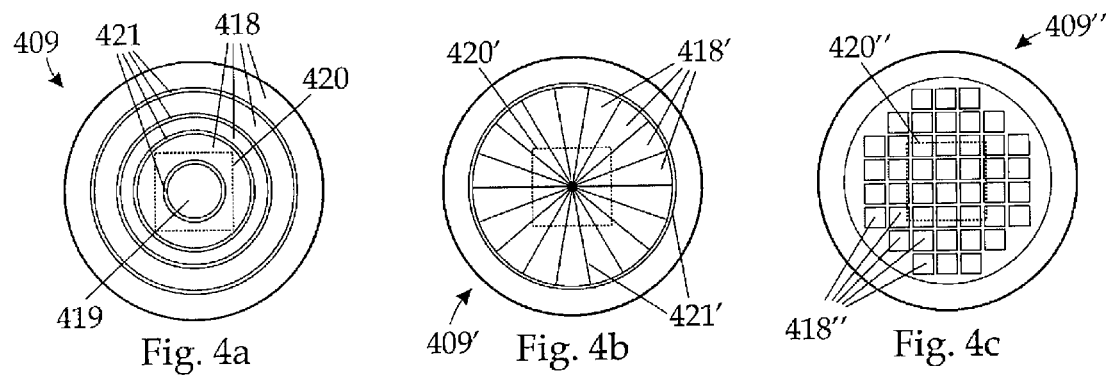
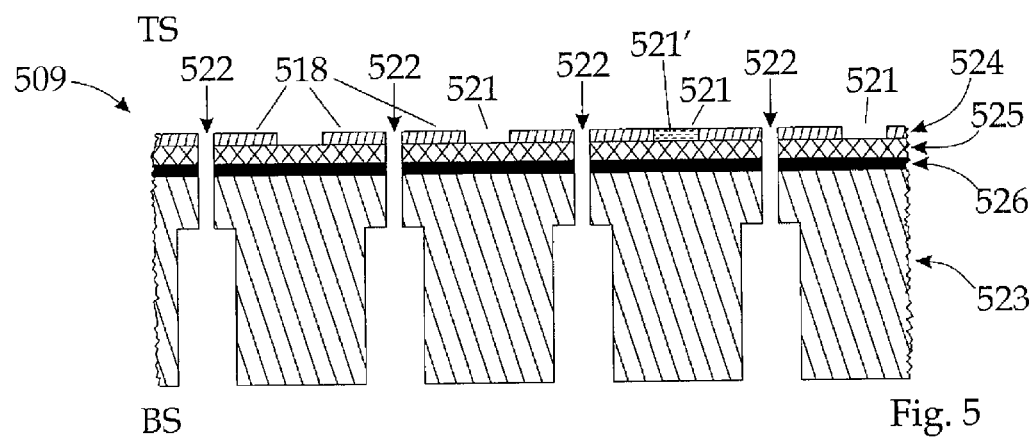
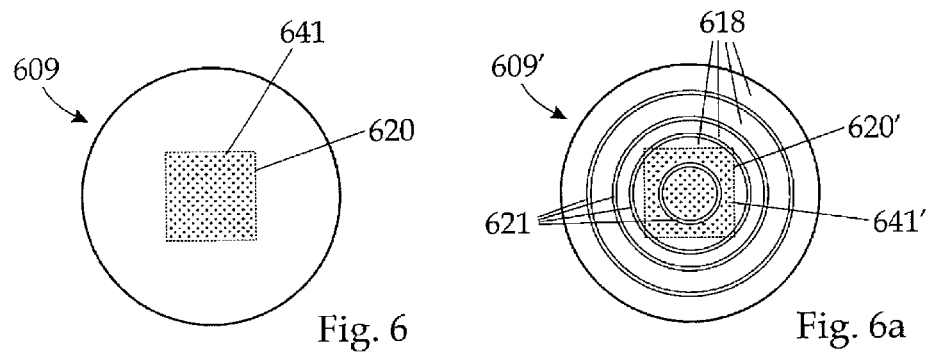

MULTI-BEAM SOURCE

FIELD OF THE INVENTION AND DESCRIPTION OF PRIOR ART

The invention relates to a multi-beam source for generating a plurality of beamlets of energetic charged particles, the multi-beam source comprising an illumination system and a beam forming system.

Furthermore, the invention is related to an electrical zone plate for use in such a multi-beam source and an apparatus for multi-beam lithography for irradiating a target by means of a beam of energetic electrically charged particles, employing such a multi-beam source.

BACKGROUND

Multi-beam sources of the above mentioned kind can be used for a variety of applications, like lithography and microscopy systems. Some of the systems employing multi-beam sources use a single source generating one beam which is subsequently split into a plurality of beamlets. The charged particle sources used in such systems typically emit a charged particle beam with a defined opening angle, i.e. a diverging beam. The diverging beam often needs to be collimated, i.e. transformed into a homogeneous beam. In most applications a lens or lens assembly is used to refract the diverging beam emitted. Improvements of such multi-beam sources are currently the subject of intensive research activities all over the world.

A typical application of a multi-beam source is a multi-beam lithography system, e.g. in the semiconductor industry, for producing patterns on different substrate materials. Such apparatus usually comprise an illumination system with a particle source, generating a diverging beam of energetic particles and a lens system for forming said beam into a telecentric beam which illuminates different means for splitting the broad beam into a plurality of sub-beams. By means of an optical projection system the sub-beams are focused on a target which is typically some kind of substrate, e.g. a silicone wafer. Systems of that kind are disclosed in the US 2005/0161621 A1, US 2005/0211921 A1 and two documents by the applicant/assignee, namely the U.S. Pat. No. 6,989,546 B2 and the U.S. Pat. No. 6,768,125. However these systems have certain drawbacks since optical systems, regardless of whether they are light-optical or particle-optical systems, produce imaging aberrations and distortions. Therefore sub-beams projected on the target will get blurred and the spot size of the sub-beam is no longer well-defined, which results in a blurry pattern or image.

It is known and general practice for particle-optical imaging systems to use electro-static lenses in the form of two or three rotationally symmetrical annular electrodes, which are formed as a tube, ring or diaphragm, or rather arrangements of such elements in rows, where a beam passes through the middle of said annular electrodes which lie at least partly at different electric potentials. Lenses of this type always have a positive refractive power and are thus focusing lenses; furthermore without exception they have significant aberrations of the third (or higher) order which can only be slightly influenced by the shape of the lens geometry. A system employing such a lens setup is disclosed in the U.S. Pat. No. 5,801,388 by the applicant/assignee.

By using diverging lenses (negative refracting power) it is possible to ensure that the aberrations produced by the arrangement of combined focusing lenses and diverging lenses are to a great extent compensated by cancellation of the contributions to the third (or higher) order aberrations of the focusing and diverging lenses, the other coefficients of aberration are also maintained as small as possible. It is not possible by means of annular electrodes alone to achieve a lens of negative refracting power; on the contrary, it is necessary to use a plate or control grid electrode through which the beam passes. A system using the mask of a lithography apparatus to form diverging lenses in combination with annular electrodes located in front of and after the mask, respectively, is disclosed in the U.S. Pat. No. 6,326,632 B1 by the applicant/assignee.

As a result of the lens errors of focusing lenses, an illumination system which comprises focusing lenses and which produces a substantially telecentric ion beam has the characteristic that, for example, although the beams in the proximity of the axis are parallel to the optical axis, the beams remote from the axis are somewhat convergent or divergent. In the outer regions of the mask this would lead to image defects, especially if used in conjunction with a large reduction optical system (such as described in U.S. Pat. No. 6,768,125) where the angular errors at the object plane (aperture plate system) lead to significant landing angle errors at the substrate, or if used in conjunction with a parallel multi-column array, where the angular alignment of each beam in each column is very critical.

One solution for avoiding these shadow effects is the production of structure orifices which are inclined accordingly with respect to the axis; however this is extremely expensive from the technology point of view. An additional diverging lens disposed downstream of the focusing lens arrangement can render it possible to correct these errors and the excessive convergence of the beams remote from the axis can be compensated.

Such a solution is described in the article "Development of a multi-electron-beam source for sub-10 nm electron beam induced deposition", J. Vac. Sci. Technol. B 23(6) (2005), pp. 2833-2839, by M. J. van Bruggen et. al. The authors therein describe a multi-beam source, where a broad beam of particles is split into 100 sub-beams with an aperture plate. The sub-beams are individually focused by a micro-lens array, creating a negative lens effect together with a subsequent electrode. Van Bruggen et. al. aim on compensating for both the third-order geometric and first-order chromatic aberration inherent in the system, however such a system can not provide for correction of the individual beams and aberrations due to insufficient illumination of the aperture plate.

The US 2004/0232349 A1 discloses a multi-beam source of the type the invention is related to. It comprises a particle source, a converging means and a lens array, placed between the source and the converging means to avoid the negative influences of the chromatic aberrations of the optical system. The lens array is substantially a plate with holes, interacting with annular electrodes placed before and/or after the lens array. In a variant of the invention as disclosed in the US 2004/0232349 A1, at least one deflector array with holes and deflectors aligned with the beamlets can be additionally included, which allows for asserting a deflecting effect proportional to the distance of a deflector from an optical axis of the respective beam. By virtue of such an arrangement, the beamlets can be controlled individually. However this solution has the significant drawback of requiring specifically shaped lens arrays, e.g. convex plates or stacks of multiple plates allotting inclined holes to account for the slope of the beamlets. Furthermore the lens arrays can scarcely be adapted to changing circumstances concerning the beamlets.

A comparable approach is described in the U.S. Pat. No. 7,084,411 B2 by the applicant/assignee, disclosing a pattern definition device for use in a particle-exposure apparatus. In said device a beam of energetic charged particles is patterned by a system of pattern definition means of substantially plate-like shape, each comprising a plurality of apertures, into a plurality of sub-beams. In order to correct for the individual aberrations that may be present in a particle-exposure apparatus, for each aperture at least two deflecting electrodes are provided for correcting the path of the sub-beam. The electrodes can be controlled individually or in groups.

In the WO 2006/084298 by the applicant/assignee, a solution for the above mentioned imaging aberrations and distortions in a charged particle exposure apparatus is proposed. The solution is applicable for instance in the IMS-concept PML2 (short for "Projection Mask-Less Lithography") as described in the U.S. Pat. No. 6,768,125 by the applicant/assignee, in which a multi-beam direct write concept using a programmable aperture plate system for structuring an electron beam is disclosed. The WO 2006/084298 describes the provision of a diverging lens that is able to compensate for aberration errors of higher rank than third order and/or distortions, or to correct specific aberration coefficients, or to correct for misalignment. The lens is realized as a plate electrode means with a plurality of apertures, comprising a composite electrode composed of a number of partial electrodes, being adapted to be applied different electrostatic potentials. This plate electrode means realizes an electrostatic zone plate (EZP), which provides a simple and yet efficient means to implement a diverging lens and/or specific compensation for the imaging problems discussed above.

SUMMARY OF THE INVENTION

The present invention provides a multi-beam source producing a set of particle beamlets with low emittance and homogeneous current distribution, the multi-beam source being adapted to reduce the various aberration effects present in existing multi-beam applications. Emittance here denotes a measure of the parallelism of a beam, a low-emittance particle beam is a beam where all individual beamlets seem to emerge from a common virtual source not significantly larger than the virtual source of an individual beam, which means that the beamlets are emerging from a small area, or, in case of a telecentric beam, are substantially parallel (virtual source infinitely far away). Beamlets with a low emittance thus have small components of transverse velocity and a reduced spread in angle relative to an axis of propagation. It is another goal of the present invention to provide a multi-beam source which is correctable/controllable with respect to deviations from the ideal angles of the beamlets to compensate imaging errors of consecutive lens systems, as for a example a projection system or multi-lens array.

These aims are met by a multi-beam source as stated in the beginning, wherein the illumination system is adapted to generate energetic electrically charged particles and to form said particles into a wide illuminating beam, and the beam forming system is configured to be illuminated by the illuminating beam emerging from the illumination system and is adapted to form a plurality of beamlets of energetic particles out of the beam, said beam forming system comprising a beam-splitting means, having a plurality of apertures transparent to the energetic particles of the particle beam to form a plurality of beamlets out of the beam, and an electrical zone device, said electrical zone device comprising a composite electrode being positioned along a two-dimensional plane oriented orthogonally to an optical axis of the electrical zone device and having lateral dimensions covering at least an area permeated by the particle beam, said composite electrode being composed of a number of substantially planar partial electrodes, said partial electrodes being arranged adjoining to each other according to a partitioning of the surface area of the electrical zone device and said partial electrodes being adapted to be applied different electrostatic potentials, the electrical zone device further comprising a plurality of openings transparent to the energetic particles of the particle beam.

The composite electrode of the electrical zone device, particularly the partial electrodes, are preferably made of electrically conductive material such as metal. However, any material can be chosen which gives rise to a well-defined electrostatic boundary if placed in an electrostatic environment with presence of electrostatic fields. One alternative to metal could be a semiconducting material with sufficient doping. Though the partial electrodes are arranged adjoining to each other, they are usually separated by small gaps.

The invention provides an effective solution to remedy insufficient illumination of beam-splitting devices frequently appearing in beam-manipulating devices. The illuminating beam irradiating the beam forming system is sufficiently wide to illuminate all of the beam forming system, i.e. also the parts remote from the optical axis of the beam forming system. The current emitted by the particle source can be processed more efficiently. Further it allows for the treatment of distortions and aberration errors of optical systems of the abovementioned kind. In general the invention presents a means to control and/or correct the beamlets of a multi-beam application with respect either to their radial and circular image distortions or to their direction. Since the beam forming system is separated from the illumination system, the multi-beam source has an augmented tolerance towards deviations of the openings with respect to the beamlet-axes.

The invention allows for correction of the illuminating particle beam before the beam splitting means (aberration errors of the illuminating system) as well as for the beam after the beam splitting device (aberration errors of the projection system). The multi-beam source according to the invention produces a plurality of beamlets that is either homocentric, i.e. seemingly emerging from a common virtual source, convergent, i.e. converging to a crossover situated somewhere below the multi-beam source as seen in the direction of the beam, or telecentric/parallel.

The aims of the invention are also met by an electrical zone device for use in a multi-beam source as mentioned above, said electrical zone device comprising a composite electrode having lateral dimensions covering the whole of the electrical zone device, said composite electrode being composed of a number of substantially planar partial electrodes, said partial electrodes being arranged adjoining to each other according to a partitioning of the surface area of the electrical zone device and said partial electrodes being adapted to be applied different electrostatic potentials, the electrical zone device further comprising a plurality of openings.

Likewise, these aims are met by an apparatus for multi-beam lithography for irradiating a target by means of a beam of energetic electrically charged particles, comprising a multi-beam source as described above for generating a plurality of substantially telecentric/parallel beamlets out of the beam of energetic electrically charged particles, and a multi-beam optical system positioned after the multi-beam source as seen in the direction of the beam for focusing the beamlets onto the surface of a target.

Preferably, the beam-splitting means and the electrical zone device are arranged in consecutive order and the openings of the electrical zone device are aligned with the apertures of the beam-splitting means. The electrical zone device can be arranged before or after the beam-splitting means, in the first case it allows for correction of the particle beam before it irradiates the beam-splitting means, in the second case it allows for correction of errors of individual beamlets or groups of beamlets, the errors being caused by the beam-splitting means or by the illumination system of the multi-beam source.

In a variant of the invention, the beam-splitting means may be integrated in the electrical zone device, e.g. in an arrangement with a plate-like shape. Thus the size of the multi-beam source could be reduced.

Depending on the application of the multi-beam source, the beamlets produced can be either homocentric, i.e. seemingly emerging from a common virtual source, or telecentric. Both variants are feasible.

Preferably, the electrically charged particles used in the multi-beam source are ions. These can be, for instance, helium ions, hydrogen ions or heavy ions, the term 'heavy' here referring to ions of elements heavier than C, such as O, N or the noble gases Ne, Ar, Kr and Xe. Protons or electrons may be used as well.

Due to the extremely short wavelength of ions, their use offers various advantageous features with respect to the imaging quality, in particular a very low numerical aperture, e.g. when the multi-beam source is used in combination with an ion optical system. In such a case the distance between the optical system and a substrate can be enlarged substantially so as to allow plenty of space for, e.g. a deflection unit, as well as enhance the decoupling of the wafer plane from the optics system.

In one advantageous realization of the invention at least one additional electrode is provided, in particular an annular electrode, said electrode being positioned in proximity of the electrical zone device but out of plane of the composite electrode of said electrical zone device. The annular electrode can be used to correct for image distortions by forming an electrostatic lens in combination with an electrical zone device. The annular electrode may be positioned before or after the electrical zone device as seen in the direction of the particle beam. Preferably, the at least one additional electrode comprises at least one multi-pole electrode, the at least one multi-pole electrode being positioned out of plane of the composite electrode of the electrical zone device.

In a preferred embodiment of the invention, the partial electrodes of the electrical zone device are arranged such that each opening of the electrical zone device is associated with a set of partial electrodes being located adjoining to the respective opening. Advantageously, the set of partial electrodes comprises four partial electrodes. Such a lay-out of partial electrodes, arranged comparably to 'lily pads' around the openings, allows for individual control of the beamlets crossing the respective opening and thus for the correction of various imaging problems. The sets of partial electrodes are set up only to influence the beamlet crossing the opening the set is associated with. As a consequence, the partial electrodes forming a set have small dimensions. Since the diameter of the openings is small compared to their mutual distance, this means that in the setup at hand, the composite electrode of the electrical zone device is divided into a multitude of partial electrodes being arranged in sets, wherein the sets are associated with an opening of the electrical zone device each, the distance between neighboring sets being large.

In another embodiment of the invention, the partial electrodes of the composite electrode of the at least one electrical zone device are shaped as concentric rings, centered at an optical axis of the electrical zone device. By virtue of this solution, a plurality of openings of the electrical zone device may be influenced by applying different electric potentials to the partial electrodes of the electrical zone device.

Various arrangements of the partial electrodes of the electrical zone device are possible and useful depending on the specific function. For instance, they may be shaped as sectors arranged around an optical axis of the electrical zone device. The sector-shaped partial electrodes may be arranged around a central area of the electrical zone device, said central area being formed by at least one further partial electrode.

Preferably, a resistive material is provided in the gaps between neighboring partial electrodes of the at least one electrical zone device. By virtue of this solution, the effect of stray electric fields between the partial electrodes may be reduced. By using an insulating, dielectric material the different potentials of neighboring partial electrodes may be separated and a dielectric polarization may be produced that reduces the total stray field at the position of neighboring openings.

A simple way to rule out effects of the stray fields occurring at the edges of partial electrodes is realized by positioning the openings of the electrical zone device such that they are present only within the areas of each of the partial electrodes of the electrical zone device. By keeping the openings remote from the gaps between neighboring partial electrodes, negative effects of the stray fields can be avoided.

In order to control the partial electrodes of the electrical zone device, a CMOS-layer containing electronic circuitry is provided within the electrical zone device which is adapted to control the partial electrodes by applying different electrostatic potentials. The provision of such a layer facilitates the production of the electrical zone device, respectively the multi-beam source, since the production of a CMOS-layer of the aforementioned kind is a well known and established technique.

In a variant of the invention direct wiring may be used to apply different electrostatic potentials to the partial electrodes for controlling them.

In an advantageous embodiment of the invention, at least one of said electrical zone devices is positioned immediately in front of or after a beam-splitting means as seen along the direction of the particle beam. By combining such an electrical zone device with an additional electrode, it is possible to form an electrostatic lens to allow for the correction of image distortions. By applying different potentials to the electrical zone device and the beam splitting means such an effect may be realized without the provision of an additional electrode.

In yet another embodiment of the invention, a first electrical zone device is positioned immediately in front of the beam-splitting means (the first one, if more than one are present) as seen along the direction of the particle beam and a second electrical zone device is positioned immediately after the beam-splitting means (the last one, if more than one are present) as seen along the direction of the particle beam. Such an arrangement improves the performance of a multi-beam source considerably, since the first electrical zone device allows for optimizing the illumination of the beam-splitting means, i.e. the plurality of apertures. The second electrical zone device may be used to correct for imaging aberrations caused by the beam-splitting means. Preferably, the partial electrodes of the electrical zone device are arranged such that each opening of the electrical zone device is associated with a set of partial electrodes being located adjoining to the respective opening. By employing at least one electrical zone device with such a 'lily pads'-arrangement the illumination and/or the correction of the imaging aberrations can be accomplished more effectively.

The invention furthermore pertains to a multi-beam source comprising a blanking device for switching off the passage of selected beamlets, said blanking device being realized in a substantially plate-like shape, comprising a plurality of openings, each opening being provided with a controllable deflection means for deflecting particles radiated through the opening off their nominal path. The openings of the blanking device are preferably aligned with the other openings present in the multi-beam source, e.g. of the electrical zone device or the beam-splitting means. Advantageously, the blanking device is provided with a CMOS-layer for controlling the deflection means. An absorbing surface may be provided to collect the particles that are deflected off their path.

It is favorable if the multi-beam source comprises at least one correction lens arrangement for the correction of geometric aberrations of the multi-beam source, the correction lens arrangement being realized having substantially a plate-like shape and comprising a plurality of orifices, the orifices widening to opening spaces at the beginning or the end of the orifices as seen in the direction of the particle beam, said opening spaces configured to act as correction lenses upon receiving the respective beamlets, said opening spaces further having a width varying over the area of the correction lens arrangement, thus defining a varying correction lens strength, the correction lens arrangement being located in front of or after the electrical zone device as seen in the direction of the particle beam.

Such a correction lens arrangement is useful to correct for optical defects such as a curvature of the image field. Since the geometric aberrations are known to vary with the distance from the optical axis of the correction lens arrangement, the width of the opening spaces of the orifices varies across the device depending on the lateral position of the corresponding orifice. The correction lens arrangement may be situated in front of the beam-splitting means as seen in the direction of the particle beam, thus locally changing the angle of incidence of the particles onto the apertures of the beam-splitting means. Alternatively, the correction lens arrangement may be positioned after the beam-splitting means as seen in the direction of the particle beam, in which case it can be used to shift the focusing length of the multi-beam source.

Preferably, the correction lens arrangement is located adjacent to an electrical zone device, the electrical zone device being arranged in front of or after the correction lens arrangement as seen along the direction of the particle beam. When the correction lens arrangement and the electrical zone device are held on different electric potentials, a correction lens can be realized. By choosing the width of the opening spaces of the orifices of the correction lens arrangement and the potential difference accordingly, a correction lens of predefined focus can be realized to allow for the correction of image distortions.

To be less prone to damage caused by the impingent beam of highly energetic particles, the electrical zone device which is closest to the illumination system may be provided with a cover layer to protect the subsequent structures of the electrical zone device from the impingent particle beam. Preferably, the cover layer is made of electrically conductive material.

As mentioned above, the invention also pertains to an electrical zone device for use in a multi-beam source of abovementioned kind.

In an advantageous embodiment of such a device, the partial electrodes of the electrical zone device are arranged such that each opening of the plurality of openings of the electrical zone device is associated with a set of partial electrodes being located adjoining to the respective opening. Preferably, the set of partial electrodes comprises four partial electrodes, thus realizing a 'lily pads'-like arrangement of the electrodes.

Various arrangements of the partial electrodes of the electrical zone device are possible and useful depending on the specific function. For instance, they may be shaped as concentric rings, as sectors arranged around an optical axis of the electrical zone device. The sector-shaped partial electrodes may be arranged around a central area of the electrical zone device, said central area being formed by at least one further partial electrode.

Good results can be obtained when a resistive material is provided in the gaps between neighboring partial electrodes. The provision of such a material allows for reducing the stray fields forming at the edges of the partial electrodes. The negative effects of such stray fields may also be reduced by positioning the openings of the plurality of openings of the electrical zone device only within the areas of each of the partial electrodes of the electrical zone device and not in the gaps between the partial electrodes.

Preferably, a CMOS-layer is provided within the electrical zone device to allow for controlling the partial electrodes of the electrical zone device by applying different electrostatic potentials. In yet another variant of the invention, the partial electrodes are controlled via direct wiring which is adapted to apply different electrostatic potentials to the partial electrodes.

In order to allow for protecting subsequent structures, the electrical zone device may be provided with a cover layer. Preferably, the cover layer is made of electrically conductive material.

The invention furthermore relates to an apparatus for multi-beam lithography of abovementioned kind, comprising a multi-beam source for the generation of a plurality of beamlets of energetic electrically charged particles and a multi-beam optical system for focusing the beamlets onto a target. Such a target may be a silicon-on-isolator (SOI) wafer coated with a resistive layer, for instance.

In one advantageous realization of the invention, the apparatus for multi-beam lithography comprises at least one blanking means for switching off the passage of selected beamlets, said blanking means having a plurality of openings, each opening being aligned with the respective openings/apertures of the multi-beam source described above, each opening further being provided with a controllable deflection means for deflecting particles radiated through the opening off their path to an absorbing surface within the multi-beam lithography apparatus, said blanking means being located before the multi-beam optical system as seen in the direction of the particle beam and/or being integrated in the multi-beam optical system. In a variant of the invention, the apparatus for multi-beam lithography comprises a multi-beam source as described above, wherein a blanking device in a substantially plate-like shape is provided within the source. Due to the very accurate positioning of the beamlets on the target to be structured, the use of a blanking means allows a relaxed requirement on the accuracy for the mechanical positioning on the wafer stage. This reduces the production expenditures and simplifies adjustment of the components of the lithography setup as well as controlling during operation.

In another realization of the invention, for each beamlet a deflection unit is provided, said deflection unit being positioned within or before the multi-beam optical system as seen in the direction of the beam, said deflection unit being adapted to correct individual imaging aberrations of its respective beamlet with respect to a desired position on the target and/or to position its respective beamlet during a writing process on the target. With said realization of the invention it is also possible to blank selected beamlets by deflecting them off their regular path. A deflection unit may be realized as an electrostatic multi-pole.

In one beneficial realization of the invention, an electrostatic lens array is placed within the multi-beam optical system. This lens array serves to adjust the beam diameter at the substrate surface. Preferably, for each beamlet an electrostatic lens arrangement is provided as a means to adjust the diameter of the beamlet and/or the position of the beamlet on the target. This facilitates the adjustment of the beamlets substantially so as to render them equivalent to each other. Such electrostatic lenses, either in the form of an array or of an arrangement for each beamlet, allow for compensation of imaging aberrations. Suitably, for instance to reduce the total space required for the optical column, this electrostatic lens arrangement is integrated within one respective lens of the multi-beam optical system.

BRIEF DESCRIPTION OF THE DRAWINGS

In the following, the present invention is described in more detail with reference to the drawings, which show:

FIG. 1 a schematic longitudinal section of a multi-beam source according to the invention producing substantially homocentric beamlets, FIG. 1a a schematic longitudinal section of a multi-beam source according to the invention producing telecentric beamlets, FIG. 2 a longitudinal section of a variant of the multi-beam source, FIG. 3 a longitudinal section of yet another variant of the multi-beam source, FIGS. 4a-4c plan views of three designs of an electrical zone device, FIG. 5 a detail of a sectional view of an electrical zone device, FIG. 6 a plan view of an embodiment of an electrical zone device with partial electrodes in a 'lily pad'-arrangement, FIG. 6a a plan view of an embodiment of an electrical zone device with a combination of partial electrodes in a 'lily pad'-arrangement and partial electrodes in the form of concentric circles, FIG. 7 a detail of the plan view of an electrical zone device of FIG. 6, FIG. 7a a detail of a sectional view of FIG. 7 along the line A-A, FIG. 8 a detail of the plan view of an electrical zone device of FIG. 6a, FIG. 8a a detail of a sectional view of FIG. 8 along the line B-B, FIGS. 9-13 longitudinal sections of different designs of the beam forming system of the multi-beam source according to the invention, with FIG. 10a showing a detail of the design depicted in FIG. 10, FIG. 14 a longitudinal section of a layout of an apparatus for multi-beam lithography according to prior art, FIG. 15 an apparatus for multi-beam lithography with a multi-beam source according to the invention, corresponding to the application of FIG. 14, FIG. 16 a longitudinal section of a layout of another apparatus for multi-beam lithography according to prior art, and FIG. 17 an apparatus for multi-beam lithography with a multi-beam source according to the invention, corresponding to the application of FIG. 16.

DETAILED DESCRIPTION OF THE INVENTION

Figure 2:
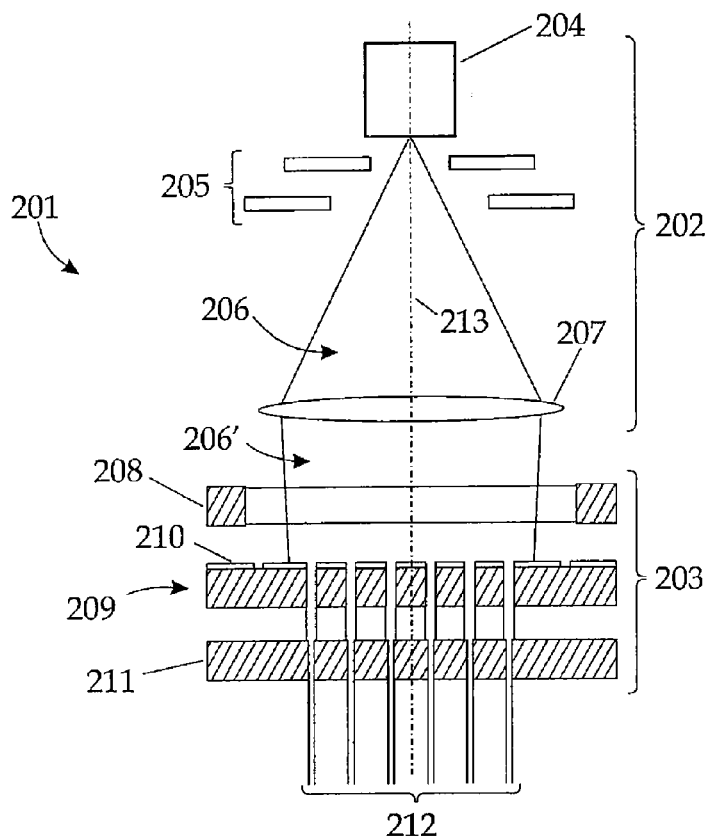

It should be appreciated that the invention is not restricted to the embodiments discussed in the following, which merely represent possible implementations of the invention. Generally it has to be said that the embodiments depicted here are only some of many different embodiments possible and are thus not intended to restrict the scope of the invention.

FIG. 1 shows a multi-beam source 101 according to the invention, comprising an illumination system 102 and a beam-forming system 103, arranged consecutively as seen in the direction of the particle beam, which propagates vertically downward in FIG. 1. The lateral dimensions of the figures are not to scale.

The illumination system 102 comprises a particle source 104 and an extractor lens array 105. Preferably, the electrically charged particles used in the multi-beam source are ions such as helium ions, but also heavier ions can be used. Protons or electrons can be used as well. The particles, emerging from the particle source 104, are formed into a diverging beam 106 by the extractor lens array 105. A collimating lens 107, which is usually realized as an electrostatic or electromagnetic lens, produces a substantially homogenous beam 106' of particles, emerging from the illumination system 102. The use of lenses has the drawback of causing chromatic and spherical aberrations, thus deteriorating the quality of the particle beam. Due to this fact the particle trajectories of the substantially homogeneous beam 106' near the outer boundary are slightly inclined against the optical axis 113 of the multi-beam source 101.

The beam-forming system 103 comprises an annular electrode 108 and an electrical zone device 109. The beam-forming system 103 forms a plurality of beamlets 112 out of the substantially homogeneous particle beam 106' emerging from the illumination system 102. The particle beam 106' is preferably homogenous over its width so as to have a particle flow sufficiently uniform within the allowed tolerances for all individual beamlets 112 which are produced from the beam. The annular electrode 108 together with the electrical zone device 109 forms a lens of negative diffracting power (divergent lens) or positive diffracting power (convergent lens), depending on the potential applied. The annular electrode 108 may be realized as a multi-pole electrode.

Figure 3:
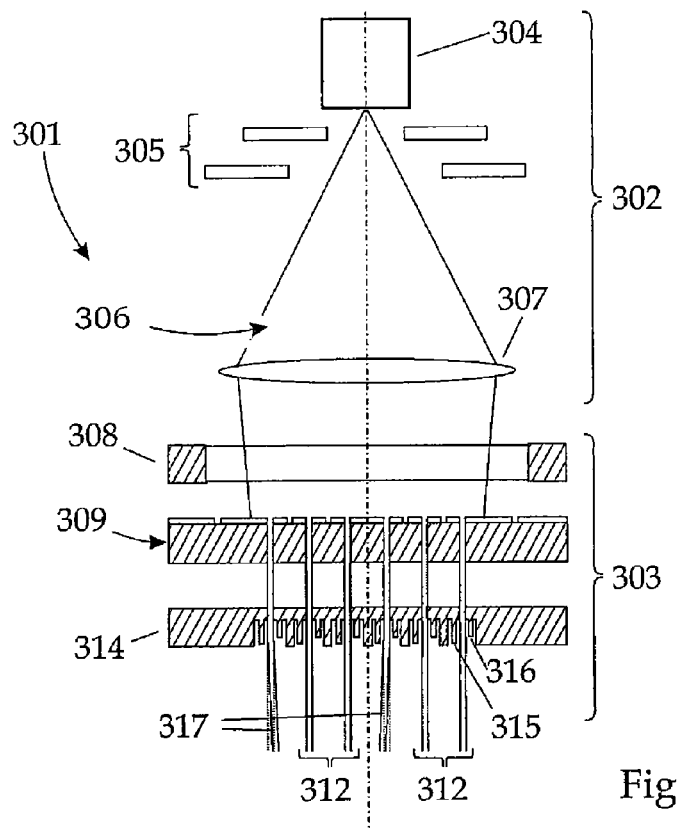

The electrical zone device 109 comprises a composite electrode 110 (shown only symbolically in FIG. 1) being positioned along a two-dimensional plane oriented perpendicular to the optical axis 113 of the multi-beam source 101. Furthermore the electrical zone device 109 comprises a plurality of openings to allow passage of the particles of the homogeneous particle beam 106' through the electrical zone device 109 and thus forming the beamlets 112 emerging from the multi-beam source 101. The beamlets shown in FIGS. 1-3 are only representative for a usually huge number of beamlets produced in the beam-forming system 103.

The composite electrode 110 is composed of a number of partial electrodes, being arranged adjoining to each other, whereas a gap is provided between the partial electrodes as discussed in further detail below. The partial electrodes are adapted to be applied different electrostatic potentials, so as to form, together with the annular electrode 108, an electrostatic lens and influence the particles passing through the openings of the electrical zone device 109. The composite electrode 110 extends over the whole area of the electrical zone device 109, irrespective of the fact that only part of the electrical zone device 109 may be irradiated by the homogeneous particle beam 106'.

The partial electrodes may extend over large fractions of the area of the electrical zone device 109 (see FIGS. 4a-4c), containing a multitude of openings aligned with the openings of the electrical zone device 109 which are thus influenced simultaneously when an electrostatic potential is applied to the respective partial electrode. However it is worth-while to mention that embodiments are possible where each partial electrode is associated to only one opening and the composite electrode 110 composed of said partial electrodes is restricted to a small region of the area of the electrical zone device 109, e.g. the region of the electrical zone device 109 where the openings are situated.

The beamlets 112 emerging from the multi-beam source 101 are homocentric, i.e. seemingly emerging from a virtual source 145 which is located above the particle source 104 as seen in the direction of the beam, which propagates vertically downward in FIG. 1. The seeming emergence of the beamlets 112 from a common virtual source 145 results in the beamlets 112 being inclined against the optical axis 113 of the multi-beam source 101, the angle of inclination increasing with the distance of the beamlet from the optical axis 113.

FIG. 1a shows a multi-beam source 101' with an illumination system 102' and a beam-forming system 103', the setup being exactly the same as in FIG. 1. However, in FIG. 1a the beam-forming system 103' is configured in a way that the beamlets 112' emerging from the multi-beam source 101' are substantially telecentric/parallel.

It is, however, possible to arrange a collimating lens 107, an annular electrode 108 and an electrical zone device 109 in such a way, that the beamlets 112 emerging from the multi-beam source 101 are convergent, i.e. converging in a cross-over being located somewhere below the multi-beam source 101, as seen in the direction of the beam.

FIG. 2 depicts a variant of the multi-beam source 201, again comprising an illumination system 202 and a beam-forming system 203. The illumination system 202 is comparable to the one depicted in FIG. 1, comprising a particle source 204, an extractor lens array 205 and a collimating lens 207 for a diverging beam 206. However, the beam forming system 203 is different: In addition to an annular electrode 208 and an electrical zone device 209 with a composite electrode 210 it comprises a beam-splitting means 211 which is arranged consecutively as seen in the direction of the particle beam.

The beam-splitting means 211 has a substantially plate-like shape and comprises a plurality of apertures transparent to the energetic particles of the particle beam. The beam-splitting means 211 and the electrical zone device 209 are arranged such that each opening of the plurality of openings of the electrical zone device 209 is aligned with an aperture of the plurality of apertures of the beam-splitting means 211. As discussed in reference to FIG. 1, the collimating lens 207 causes optical aberrations which is illustrated in FIG. 2 by the substantially homogeneous beam 206' being inclined against the optical axis 213 of the multi-beam source 201. The combination of annular electrode 208 and electrical zone device 209 provides for correction of the imaging errors introduced by the lenses of the illumination system 202. Also it allows for homogenous illumination of the beam-splitting means 211, thus solving a common problem of particle-optical systems namely that the illumination decreases with increasing distance from the optical axis 113, resulting in shadow effects.

Since the electrical zone device 209 serves to improve illumination of subsequent devices and the forming of the substantially telecentric/parallel beamlets 212 is carried out by the subsequent beam-splitting means 211, the width of the openings of the electrical zone device 209 is usually larger than the width of the apertures of the beam-splitting means 211. This ensures sufficient illumination of the apertures of the beam-splitting means 211.

FIG. 3 shows yet another variant of the multi-beam source 301, comprising an illumination system 302 and a beam-forming system 303. The illumination system 302 is formed by a particle source 304 and an extractor lens array 305, forming a diverging beam 306 which is collimated by a collimating lens 307.

An annular electrode 308 together with an electrical zone device 309 provides for substantially homogeneous illumination of a blanking device 314, the annular electrode 308, the electrical zone device 309 and the blanking device 314 being arranged in consecutive order as seen in the direction of the particle beam.

In contrast to FIG. 2, the forming of substantially telecentric/parallel beamlets 312 is here provided by a blanking device 314, which allows for additional treatment of the respective beamlets 312, 317.

The blanking device 314 is realized in a substantially plate-like shape and comprises a plurality of openings allowing for the particles of the particle beam to pass through the blanking device 314. The blanking device 314 is arranged such that its openings align with the respective openings of the electrical zone device 309.

Every opening of the blanking device 314 is associated with a pair of electrodes 315, 316 being adapted to deflect the particle-beamlet passing through the respective opening. For this purpose, one electrode acts as active deflecting electrode 316 and the other electrode acts as ground electrode 315. When the deflecting electrode 316 is energized, i.e. voltage is applied to the electrode, the beamlet passing by the deflecting electrode 316 is deflected off its nominal path. The electrodes may be organized in groups, so that the controlling of the beamlets may be performed synchronously for all groups. This reduces the supply and controlling elements for the electrodes, and at the same time reduces the risk of cross-talk effects. FIG. 3 shows exemplarily a number of undeflected parallel beamlets 312 and two distracted beamlets 317 that are deflected by their respective pair of electrodes 315, 316, which are thus inclined against the optical axis 313 of the multi-beam source 301.

The electrodes 315, 316 are located in a depression that is formed around the opening with which the electrodes are associated. Their height is chosen such that they do not protrude over the surface of the blanking device 314 they are manufactured in. The electrodes 315, 316 may be formed by well established lithography techniques.

The sequence of components of the beam-forming systems 103, 203, 303 in FIGS. 1-3 are only a few of many possible arrangements, variants thereof are depicted in FIGS. 9-13.

The electrical zone device 109, 209, 309 can be realized in different ways. FIGS. 4a-4c show different exemplary variants. FIG. 4a depicts a plan view of an electrical zone device 409. It features a planar, basically two-dimensional composite electrode that is composed of circular concentric partial electrodes 418 around a central partial electrode 419. The plurality of openings of the electrical zone device 409 is located in a field 420 which includes the central partial electrode 419. For the sake of clarity, no openings are depicted in FIG. 4a. Different electrostatic potentials can be applied to the partial electrodes 418, 419. For mutual insulation, and to reduce the influence of stray fields, there are gaps 421 provided between the partial electrodes 418, 419.

FIG. 4b shows a different arrangement of the partial electrodes 418' of an electrical zone device 409'. The area of the composite electrode here is divided into sector electrodes 418' extending into the field 420' in which the openings are located and separated by gaps 421'.

The plan view of FIG. 4c shows yet another variant of an electrical zone device 409" with a mosaic-shaped assemblage of partial electrodes 418". The rectangular partial electrodes 418" cover the area within and preferably also beyond the field 420" the openings are located in. The electrical field can be controlled in both dimensions of the electrical zone device 409", i.e. xy-direction, assuming a two-dimensional coordinate system being assigned to the electrical zone device 409".

A schematic setup of an electrical zone device 509 is depicted in FIG. 5. It shows a detail of a longitudinal section view of such a device. In order to facilitate the description of the device, the terms topside TS and bottom side BS are used here. These terms of the two sides are not related to the orientation of the electrical zone device with regard to the incoming particle beam—either side may be directed towards the impingent beam.

The bulk of the electrical zone device 509 is formed by a silicon plate 523, covered with three layers 524, 525, 526.

Located on top, e.g. on the topside TS, is the composite electrode in the form of a segmented electrode layer 524. It realizes the partial electrodes 518 to which different electrostatic potentials can be applied in order to influence the path of the beamlets that pass through the openings 522 of the electrical zone device 509. Some possible arrangements of partial electrodes are depicted in FIGS. 4a-4c, however the invention is not restricted to these embodiments. In the electrode layer 524, gaps 521 are provided between the zones covered by the different partial electrodes 518. These gaps make for reducing the mutual influence of neighboring partial electrodes 518 that produce stray fields when an electrostatic potential is applied to them. Another way of coping with said stray fields is realized by filling the gaps 521 with a resistive material 521'. By virtue of this solution, the effect of stray electric fields forming between the partial electrodes may be reduced. By using an insulating, dielectric material the different potentials of neighboring partial electrodes 518 may be separated and a dielectric polarization may be produced that reduces the total stray field at the position of neighboring openings 522. For the sake of clarity, FIG. 5 shows gaps 521 that are left empty as well as gaps 521 filled with a resistive material 521'. Usually only one of the two variants will be implemented on one device, however, it is also possible to realize a combination of the two variants.

Beneath the electrode layer 524 an isolating layer 525 is located. The thickness of this layer is chosen sufficient so it can accommodate also the supplying lines (not shown) for applying electrostatic potentials to the partial electrodes of the electrode layer 524. Typically a CMOS-layer is used for that purpose. However, it is also possible to supply the partial electrodes 518 with the electrostatic potentials via direct wiring (not shown). Direct wiring here indicates every electrode being provided with its own feed line for applying an electric potential. In this case an isolating material with a smaller thickness may be used for the isolating layer 525, since no supply lines have to be accommodated.

Below the isolating layer 525 a conductive layer 526 is situated which shields the partial electrodes 518 from any electrical field that may emerge from the direction of the bottom side BS.

FIGS. 4a-4c show embodiments of an electrical zone device where the composite electrode extends over the whole surface of the device and the partial electrodes are arranged adjoining to each other, with only small gaps in between. FIG. 6 depicts yet another embodiment: The composite electrode of the electrical zone device 609 is realized as a multitude of partial electrodes in the form of pads 641. For the sake of better understanding, partial electrodes in said form will be called 'pads' in the following. In FIG. 6 the pads 641 are located only within the field 620 where the openings of the electrical zone device 609 are located. Size and number of the openings and the partial electrodes are not to scale in FIG. 6 for the sake of visibility.

Every opening of the plurality of openings of the electrical zone device 609 is provided with a set of pads 641, forming the partial electrodes. The pads 641 belonging to such a set are arranged adjoining to each other and are adapted to be applied an electrostatic potential. Every pad 641 can be supplied with an electrostatic potential independently. The pads 641 are adapted to influence a particle-beamlet crossing the opening of the electrical zone device 609 the pads 641 are located on. Depending on the electrostatic potential applied to an electrode, it either repels or attracts a beamlet. By virtue of this solution it is possible to individually influence the path of a beamlet and correct chromatic or spherical aberrations or other deficiencies of the beamlet, e.g. when its path is affected by an opening that is not exactly parallel to the optical axis of the electrical zone device. It is not necessary to provide an additional annular electrode as is the case for the embodiments shown in FIGS. 4a-4c.

FIG. 6a shows yet another embodiment of an electrical zone device 609'. It comprises composite electrodes according to two aspects of the invention at the same time. The first composite electrode is realized as a substantially two-dimensional layer, consisting of a number of circular concentric partial electrodes 618 which are separated from each other by small gaps 621 to reduce the effects of stray fields. A second composite electrode is formed by a multitude of partial electrodes in the form of pads 641', being located in a field 620'. The pads 641' are formed on top of the circular concentric partial electrodes 618, however advantageously an isolating layer is provided between them. Each pad 641' is associated with an opening of the electrical zone device 609'. For the sake of clarity it is mentioned that in the direct proximity of a gap 621 between partial electrodes 618 of the first composite electrode, neither openings nor pads 641' are located. In order to fully exploit the advantageous features of the electrical zone device 609' depicted in FIG. 6a, it should be combined with an annular electrode.

Figure 7:
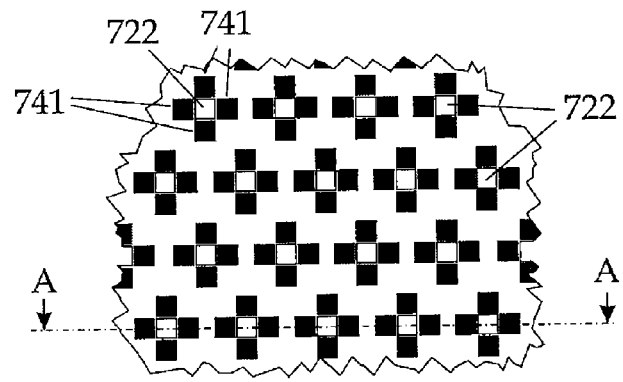

FIG. 7 shows a detail of a plan view of the field 620 of an electrical zone device 609 as depicted in FIG. 6. FIG. 7 shows a sample of openings 722 with their respective sets of pads 741. In the present example, a set contains four pads 741. The openings 722 have a quadratic shape and the pads 741 are arranged on each side of the openings 722, the arrangement resembling 'lily pads'. However it should be appreciated that the invention is not restricted to the embodiment discussed in the following, which merely represents one of the possible implementations. Different numbers of pads 741 per set are possible as well as other shapes of the openings 722, like circular or rectangular. The area between neighbored sets of pads 741 can either be left empty or be provided with an isolating or dielectric material.

Figure 7A:
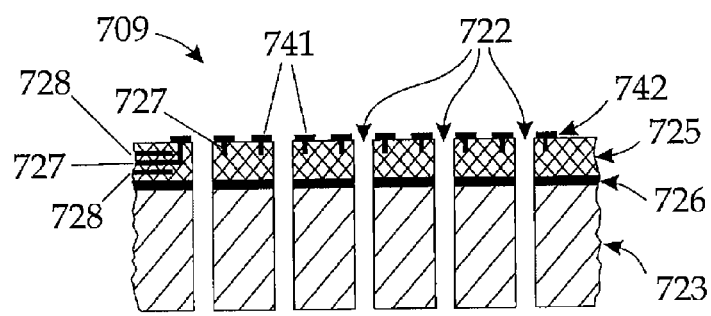

FIG. 7a shows a longitudinal section detail of an electrical zone device 709 taken along the line A-A of FIG. 7. A silicon plate 723 is covered with three layers 742, 725, 726: A conductive layer 726 shields the other layers from any electric field that may emerge from the silicon plate 723. An isolating layer 725 accommodates the supply lines 727, e.g. in the form of strip conductors, that are needed to control and supply the pads 741 that form the 'lily pad'-layer 742. Each of the pads 741 is associated with an opening 722 that reaches through the electrical zone device 709 and allows for the transition of energetic particles in the form of beamlets. The path of the beamlets can be influenced by applying an electrostatic potential to the respective pads 741. Preferably, the isolating layer 725 is realized as a CMOS-layer which is best suited to accommodate the wiring, also the production of such a CMOS-layer is a well established process in the semiconductor industry. In order to shield the supply lines 727 from any electric field, screening conductors 728 are provided above and below the supply lines 727.

The setup depicted in FIGS. 7 and 7a allows for the individual handling of each beamlet passing through a respective opening 722 of the electrical zone device 709. Thus displacements of the beamlets, e.g. due to mechanical deficiencies of the openings of the electrical zone device 709, can be corrected.

Figure 8:
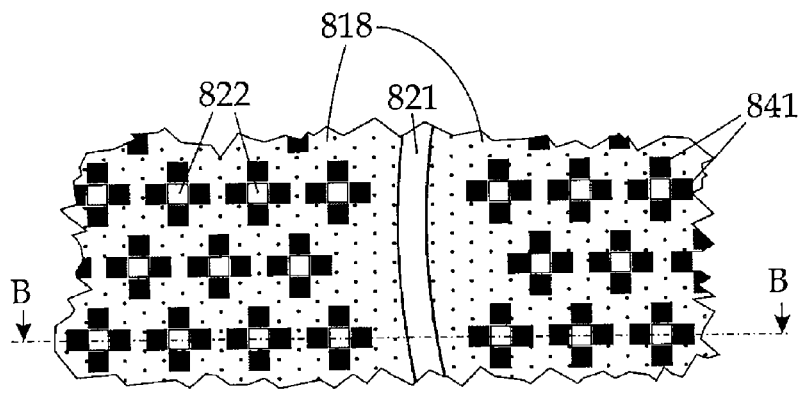

FIG. 8 shows a detail of a plan view of the field 620' of an electrical zone device 609' as depicted in FIG. 6a. The partial electrodes 818 of the first composite electrode are here separated by a small gap 821. On top of the partial electrodes 818, the pads 841 are located, arranged in 'lily pad'-like sets of four around each opening 822. The width of the gap 821 usually amounts to about 1 µm, which is typically much smaller than the distance between the apertures usually arranged in a regular 2D translational array. The small gap 821 may also be positioned right in between the apertures without breaking the translational symmetry across the gap area (as for example shown in FIG. 5 where the aperture spacing is not changed by the gap), possibly meandering through the space between the apertures or 'lily pads'.

Figure 8A:
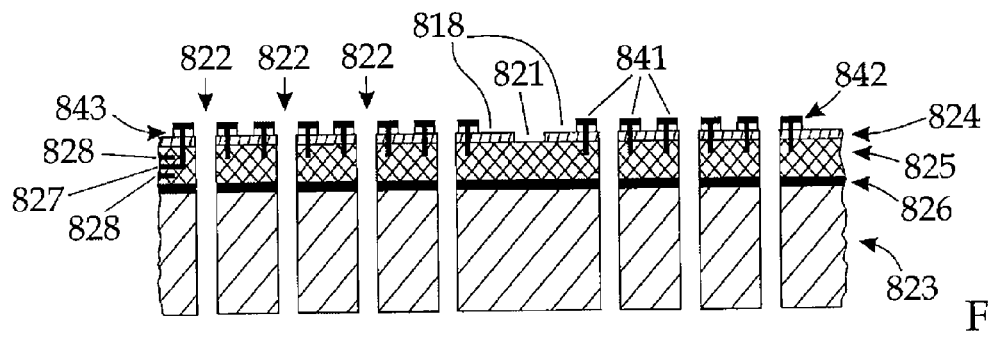

FIG. 8a shows a longitudinal section detail of an electrical zone device 809 from the plan view of FIG. 8 along the line B-B.

A silicon plate 823 is covered with different layers which are explained bottom up according to the arrangement depicted in FIG. 8a: A conductive layer 826 shields the other layers from any electric field that may emerge from the silicon plate 823. An isolating layer 825 accommodates the wiring for the partial electrodes 818 and the 'lily pads' 841. Only the supply lines 827 for the 'lily pads' 841 are shown in FIG. 8a, the wiring for the partial electrodes 818 is not shown, though located in the isolating layer 825 as well. Screening conductors 828 are provided above and below the supply lines 827 to shield them from any electric field. Similar screening devices are provided for the wiring of the partial electrodes 818, however they are not depicted in FIG. 8a for the sake of clarity. Preferably, the isolating layer is realized as a CMOS-layer.

On top of the isolating layer, an electrode layer 824 is provided, forming the first composite electrode, thus containing the partial electrodes 818 which are separated by gaps 821. Between the electrode layer 824 and the 'lily pad'-layer 842, a second isolating layer 843 is provided to prevent the 'lily pads' 841 from being influenced by the electric field of the partial electrodes 818. Each of the 'lily pads' 841 is associated with an opening 822 of the electrical zone device 809, the openings 822 allowing for energetic particles to pass through the electrical zone device 809.

The combination of extended partial electrodes 818, covering many openings 822 of the electrical zone device 809, with sets of 'lily pads' 841, each set being associated with only one opening 822, allows for the correction of imaging aberrations of the whole beam/all beamlets as well as of small displacements of individual beamlets.

Figure 9:
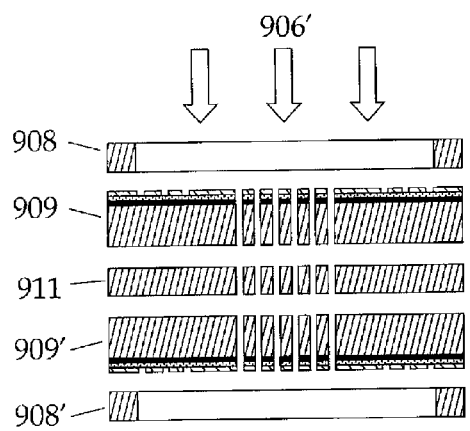

FIGS. 9 to 13 show different embodiments of a beam-forming system of a multi-beam source according to the invention. In FIG. 9, a substantially homogenous beam 906' of charged particles passes through a first annular electrode 908 and impinges upon an electrical zone device 909, formed according to, for instance, one of the embodiments discussed above. In order to protect the different layers of the electrical zone device 909 from the energetic particles of the impinging beam, a protective layer (not shown) may be provided on top of the other layers, closest to the impingent beam. The electrical zone device 909 in combination with the annular electrode 908 corrects for optical aberrations of the beam 906' and simultaneously forms the substantially homogeneous beam 906' into a number of beamlets. Further it is suited to improve the illumination of the subsequent beam-splitting means 911 which is arranged after the electrical zone device 909, as seen in the direction of the particle beam. The beam-splitting means 911 forms a multitude of substantially telecentric/parallel beamlets of energetic particles with a desired diameter. The beamlets pass through a second electrical zone device 909' that is combined with a second annular electrode 908' to form an electrostatic lens. This lens allows for the correction of imaging aberrations. Depending on the variant of the electrical zone device used it is even possible to influence the path of individual beamlets, e.g. when an electrical zone device employing the 'lily pads'-arrangement is used.

Figure 10:
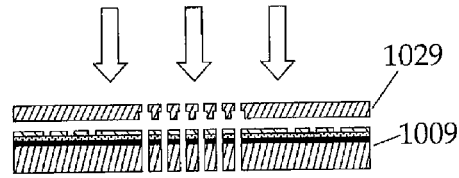

FIG. 10 shows a sectional view of an arrangement with a correction lens arrangement 1029 and an electrical zone device 1009. Instead of an annular electrode the electrical zone device 1009 in combination with the correction lens arrangement 1029 forms an electrostatic lens for correction of geometric aberrations of the illumination system. For that purpose, the correction lens arrangement 1029 and the electrical zone device 1009 are kept on different electrostatic potentials. The correction lens arrangement 1029 has a substantially plate-like shape with a number of orifices, each orifice being aligned with a respective opening of the plurality of openings of the electrical zone device 1009 which is located subsequently to the correction lens arrangement 1029 as seen in the direction of the beam.

Figure 10A:
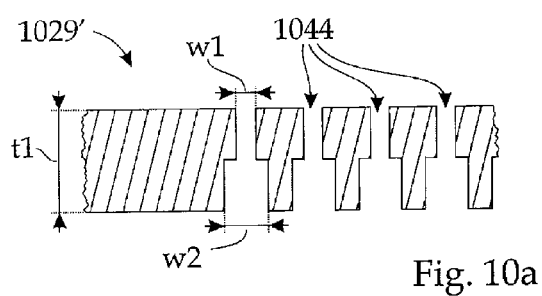

FIG. 10a shows a detail of a correction lens arrangement 1029' as depicted in FIG. 10 with some orifices 1044. The width of the orifices changes across the section of the arrangement.

A first width w1 in the part of the orifice 1044 that is directed towards the incoming beam is much smaller than a second width w2, located on the opposite surface. The ratio of the first width w1 and the second width w2 and the thickness t1 as well as the electrostatic potentials applied to the correction lens arrangement 1029, 1029' and the electrical zone device 1009 define the strength of the lens that is formed by the combination of the latter two.

The more offset from the optical axis of the correction lens arrangement 1029' an orifice 1044 is located, the more the axis of the beamlet passing through it may be declined against the optical axis of the electrical zone device, necessitating a correction. Therefore the widths w1, w2 of the orifices may vary across the area of the electrical zone device depending on the lateral position of the corresponding orifice. In the embodiment depicted in FIG. 10, where the correction lens arrangement is situated in front of the electrical zone device 1009, it locally changes the angle of incidence of the particles onto the electrical zone device. By virtue of this solution it is possible to ameliorate the illumination of the electrical zone device and allow for correction of imaging aberrations.

Figure 11:
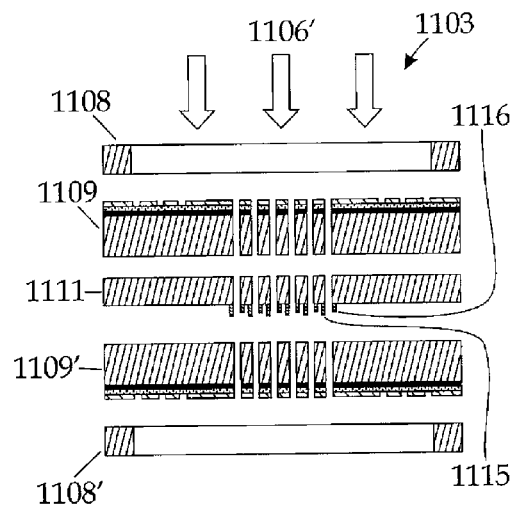
Figure 12:
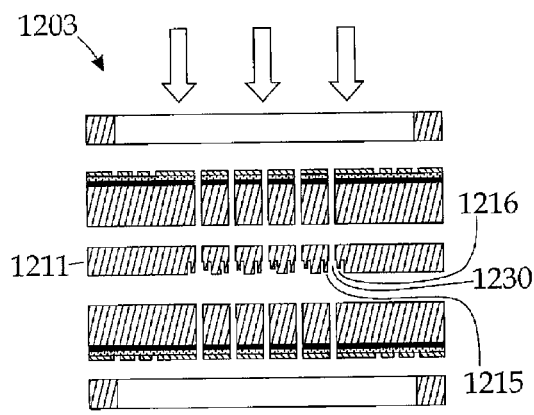
Figure 13:
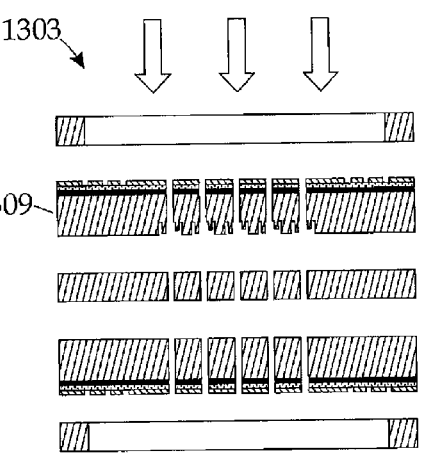

FIGS. 11-13 show different embodiments of a beam-forming system employing a blanking means, used to adjust the nominal path of selected beamlets. Every embodiment contains a first annular electrode, a first electrical zone device, a beam-splitting means, a second electrical zone device and a second annular electrode. The sequence of the parts of the beam-forming system is basically the same in FIGS. 11-13, however it has to be pointed out that this is not intended to restrict the invention in any kind, since other sequences are possible as well.

FIG. 11 displays a beam-forming system 1103 wherein a broad beam of charged particles 1106' passes through a first annular electrode 1108 and irradiates an electrical zone device 1109. After the electrical zone device as seen in the direction of the beam, a beam-splitting means 1111 is located. The beam-splitting means is followed by a second electrical zone device 1109', combined with a second annular electrode 1108'.

Every aperture of the beam-splitting means 1111 is associated with a pair of electrodes 1115, 1116 which are adapted to be applied different electrostatic potentials, thereby producing an electrical field which influences the path of the beamlet that passes through the respective aperture. One of the electrodes 1115, 1116 acts as ground electrode 1115, whereas the other electrode is the active deflecting electrode 1116. The electrodes are preferably located on the surface of the beam-splitting means 1111 that is oriented away from the incoming beamlets. By means of the electrodes 1115, 1116 it is possible to blank out selected beamlets by directing them off the nominal path that leads through the opening of the second electrical zone device 1109', causing them to hit the second electrical zone device 1109' and be absorbed there. For that purpose an absorbing layer (not shown) may be provided on the surface of the second electrical zone device 1109' that is directed towards the incoming beamlets. In another possible embodiment, a separate absorbing layer (not shown) may be provided for that purpose.

In FIG. 11 the electrodes 1115, 1116 are depicted as being located 'on' the surface of the beam-splitting means 1111, in the sense of not-being an integral part of said means. Such electrodes could be formed by perpendicular growth employing state-of-the-art electroplating techniques.

The blanking means depicted in the arrangements of FIGS. 12 and 13 are formed differently. FIG. 12 shows a beam-forming system 1203 containing the same parts as the arrangement in FIG. 11, but the beam-splitting means 1211 features recesses 1230 around each aperture, accommodating the electrodes 1215, 1216. The electrodes 1215, 1216 in this embodiment may be formed e.g. by application of known etching techniques. FIG. 13 depicts a beam-forming system 1303 wherein the electrodes and the respective recesses are formed in the first electrical zone device 1309. For the sake of clarity it is pointed out that it is also possible to include a separate blanking device in the beam-forming systems, a variant that is not depicted in the figures. Also it has to be mentioned that in each of the cases described, the beam splitting could be taken over by the electrical zone device, thus rendering obsolete a self-contained beam-splitting means by providing a combined 'beam-splitting electrical zone device'.

Multi-beam sources of the kind as described above are suitable for a lot of different purposes. One possible application is in a multi-beam lithography system, e.g. in the semiconductor industry, for producing patterns on different substrate materials.

Figure 14:
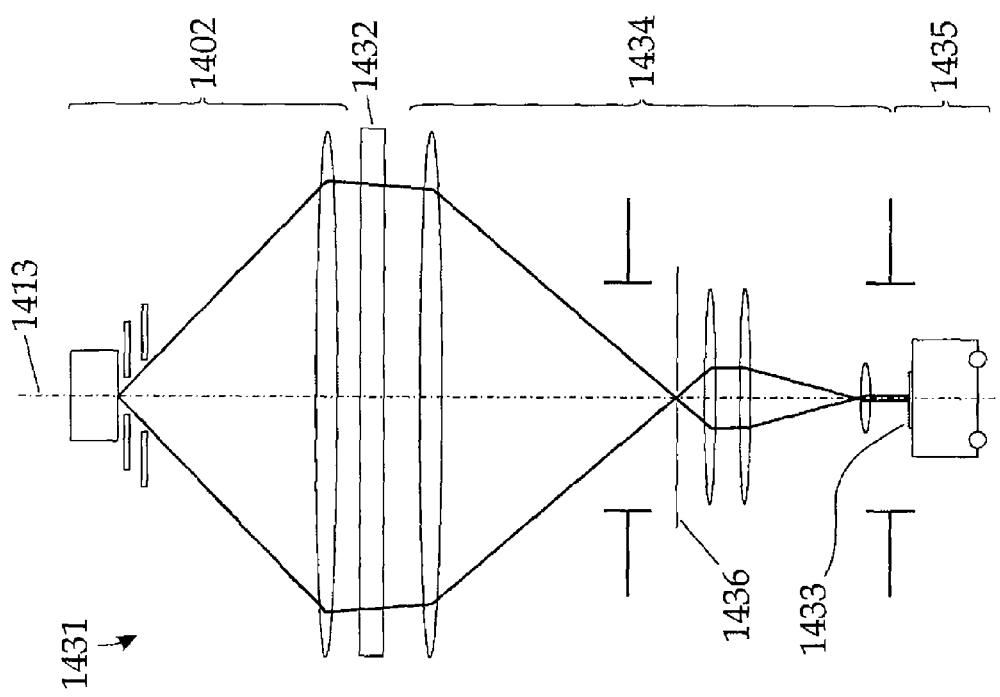

FIG. 14 shows such a lithography system 1431 as disclosed in the U.S. Pat. No. 6,768,125 B2 by the applicant/assignee. The concept, dubbed PML2 (short for 'Projection Mask-Less Lithography #2'), basically comprises an illumination system 1402, a pattern definition device 1432, a projecting system 1434 and a target station 1435 with a substrate 1433. For the sake of clarity, the components are not shown to size in FIG. 14.

The illumination system 1402 produces a lithography beam which propagates vertically downwards in FIG. 14. The beam may consist of electrically charged particles of different kind—apart from electrons these can be, for instance, helium ions, hydrogen ions or heavy ions, here referring to ions of elements heavier than C, such as O, N or the noble gases Ne, Ar, Kr, Xe. The pattern definition device 1432 comprises a number of plates stacked on top of the other, among them an aperture array means (aperture plate) and a deflector array means (blanking plate). The plates each comprise a multitude of openings, the openings of the different plates aligning with each other. The separate plates are mounted together at defined distances, for instance in a casing. The pattern definition device 1432 defines a beam pattern, consisting of beamlets, to be projected on the substrate 1433. With the deflector array means beamlets can be deflected off their nominal path, thus being blanked and not reaching the target surface. The beamlets may be deflected such that they are absorbed by a stop plate 1436. By means of electrostatic or electromagnetic lenses the projecting system 1434 displays the pattern provided by the pattern definition device 1432 on the substrate 1433.

Lithography apparatus of the abovementioned kind have various problems, e.g. the illumination of the plates of the pattern definition device 1432 may be insufficient, especially in the regions remote from the optical axis 1413 of the lithography system 1431. Also the use of electrostatic or electromagnetic lenses causes optical errors like spherical and chromatic aberrations.

Figure 15:
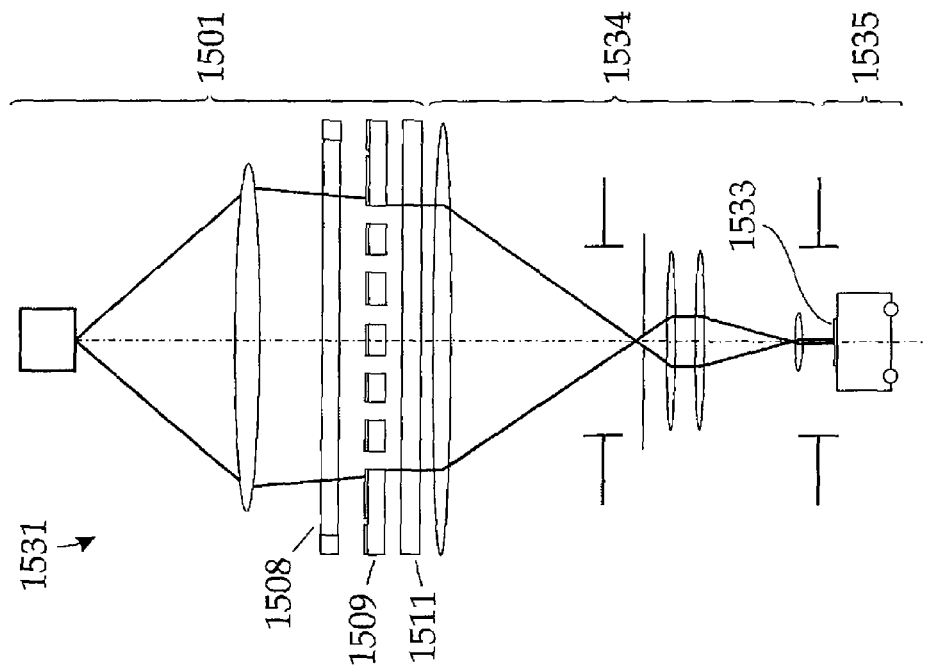

Said problems may be reduced to a great extent when a multi-beam source according to the invention is used instead of the illumination system 1402. Such an arrangement is shown in FIG. 15, where a multi-beam lithography system 1531 is depicted—the components are not shown to size here for the sake of clarity. A multi-beam source 1501 is provided to produce a multitude of beamlets that is projected on a substrate 1533 in a target station 1535 by a projecting system 1534. In principle any of the multi-beam sources 1501 described above can be used here. In the embodiment depicted in FIG. 15 the provision of an electrical zone device 1509 together with an annular electrode 1508 allows for amelioration of the illumination of the beam-splitting means 1511 that is arranged consecutively to the electrical zone device 1509 as seen in the direction of the beam. The beam-splitting means 1511 may comprise a blanking means as in FIGS. 11-13 to allow for the blanking of selected beamlets.

Figure 16:
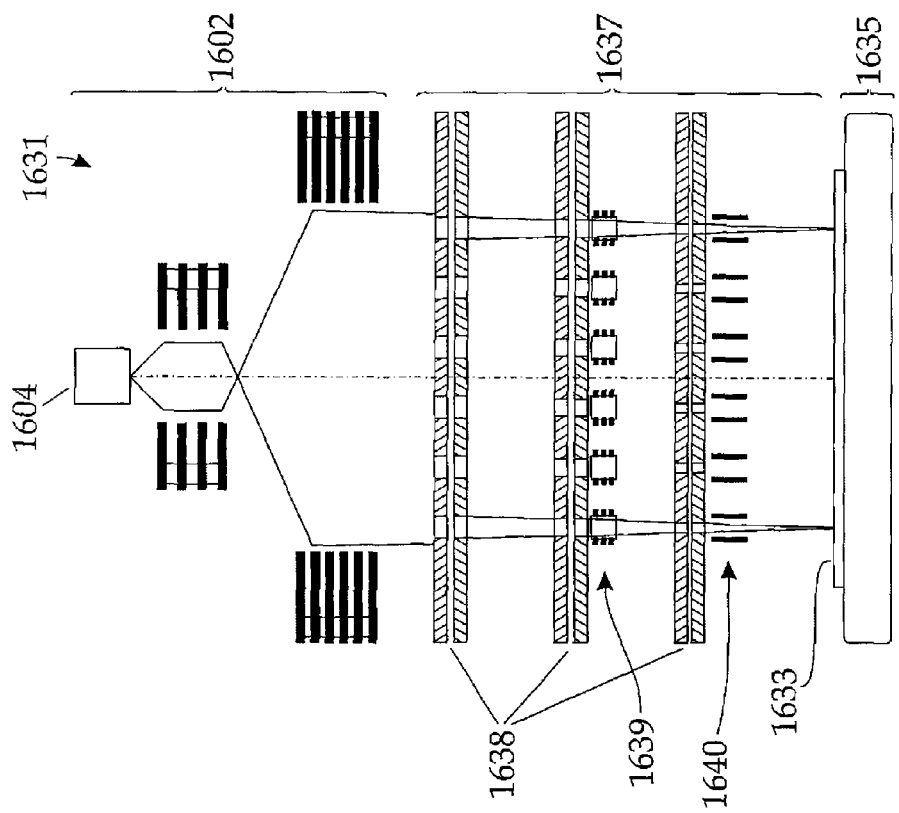

FIG. 16 shows yet another multi-beam lithography system 1631 of prior art. Such a system is disclosed in the U.S. Pat. No. 6,989,546 B2 by the applicant/assignee. The lithography apparatus 1631 is adapted to write structures on a resist-covered wafer substrate 1633 that is located on a target station 1635. The apparatus comprises an illumination system 1602 with a particle source 1604 and a collimator optics system producing an illuminating beam of electrically charged particles. A multi-beam optical system 1637 is located after the illumination system 1602, comprising an arrangement of electrostatic aperture plates 1638 with additional imaging elements. The aperture plates 1638 form the beam into a plurality of beamlets, wherein the aperture plates 1638 are designed in such a way that that each of the beamlets is successively focused into a concentrated intensity on the wafer substrate 1633. For the sake of clearness only a reduced number of beamlets is shown in FIG. 16. In order to adjust the focusing properties of the beamlets individually, e.g. with respect to the beam diameter, and correct for any aberrations introduced by the illumination system 1602, an arrangement of electrostatic lenses 1639 is provided, for instance between the aperture plates 1638. A multi-pole arrangement 1640, comprising an individual deflection unit for each beamlet, which is arranged after the aperture plates 1638 as seen in the direction of the beam, allows to further adjust the beamlets, e.g. with respect to the position on the wafer substrate 1633.

The arrangement depicted in FIG. 16 allows for the correction of individual imaging aberrations of the respective beamlets. However, the performance of the lithography system 1631 may be ameliorated by using a multi-beam source according to the invention instead of the illumination system 1602.

Figure 17:
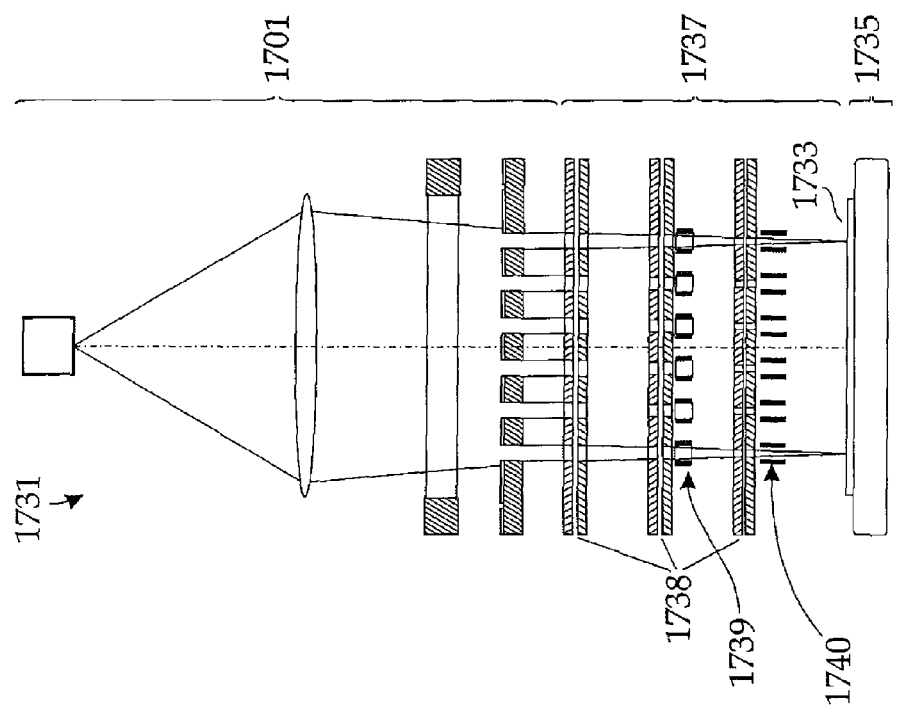

FIG. 17 depicts an improved multi-beam lithography apparatus 1731 comprising a multi-beam source 1701, a multi-beam optical system 1737 with a number of electrostatic aperture plates 1738 with additional imaging elements and a wafer substrate 1733 on a target station 1735. The use of a multi-beam source 1701 according to the invention allows for an ameliorated illumination of the electrostatic aperture plates 1738 as well as for reduced imaging aberrations that arise in an arrangement as depicted in FIG. 16 where the illumination system is combined with a collimator optics system employing electrostatic or electromagnetic lenses.

Even though the provision of a multi-beam source according to the invention seems to render obsolete an arrangement of electrostatic lenses 1739, it is still employed ion FIG. 17 since it allows to correct for any remaining imaging aberrations as well as for errors that may be introduced by mechanical deficiencies of any of the plates or devices employed. Such a deficiency could be the axis of an opening or aperture not being exactly parallel to the optical axis 1713 of the multi-beam lithography apparatus 1731 or alignment errors of the different plates and devices. Also a multi-pole arrangement 1740, comprising an individual deflection unit for each beamlet, is provided to allow for accurate positioning of the beamlets on the substrate 1733.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

I claim:

1. A multi-beam source for generating a plurality of beamlets of energetic electrically charged particles, the multi-beam source comprising:
   an illumination system; and
   a beam-forming system,
   wherein the illumination system is adapted to generate energetic electrically charged particles and to form said particles into a wide illuminating beam, and
   the beam forming system is configured to be illuminated by the illuminating beam emerging from the illumination system and is adapted to form a plurality of beamlets of energetic particles out of the beam, said beam forming system comprising:
      a beam-splitting means having a plurality of apertures transparent to the energetic particles of the particle beam to form the plurality of beamlets out of the beam, and
      an electrical zone device, said electrical zone device comprising a composite electrode being positioned along a two-dimensional plane oriented orthogonally to an optical axis of the electrical zone device and having lateral dimensions covering at least an area permeated by the particle beam, said composite electrode being composed of a plurality of substantially planar partial electrodes, said partial electrodes being arranged adjoining to each other according to a partitioning of the surface area of the electrical zone device and said partial electrodes being adapted to be applied different electrostatic potentials, the electrical zone device further comprising a plurality of openings transparent to the energetic particles of the particle beam.

2. The multi-beam source of claim 1, wherein the beam-splitting means and the electrical zone device are arranged in consecutive order and the openings of the electrical zone device are aligned with the apertures of the beam-splitting means.

3. The multi-beam source of claim 1, wherein the beam-splitting means is integrated in the electrical zone device.

4. The multi-beam source of claim 1, wherein the plurality of beamlets produced by the multi-beam source are substantially homocentric.

5. The multi-beam source of claim 1, wherein the plurality of beamlets produced by the multi-beam source are substantially telecentric.

6. The multi-beam source of claim 1, wherein the electrically charged particles are ions.

7. The multi-beam source of claim 1, further comprising at least one additional electrode, in particular an annular electrode, said electrode being positioned in proximity of the electrical zone device but out of the plane of the composite electrode of said electrical zone device.

8. The multi-beam source of claim 7, wherein the at least one additional electrode comprises at least one multi-pole electrode, the at least one multi-pole electrode being positioned out of the plane of the composite electrode of the electrical zone device.

9. The multi-beam source of claim 1, wherein the partial electrodes of the electrical zone device are arranged such that each opening of the electrical zone device is associated with a set of partial electrodes being located adjoining to the respective opening.

10. The multi-beam source of claim 9, wherein the set of partial electrodes comprises four partial electrodes.

11. The multi-beam source of claim 1, wherein the partial electrodes of the electrical zone device are shaped as concentric rings, centered at an optical axis of the electrical zone device.

12. The multi-beam source of claim 1, wherein the partial electrodes of the electrical zone device are shaped as sectors arranged around an optical axis of the electrical zone device.

13. The multi-beam source of claim 1, wherein the partial electrodes of the electrical zone device are sector-shaped and arranged around a central area of the electrical zone device, said central area being formed by at least one further central partial electrode.

14. The multi-beam source of claim 1, wherein a resistive material is provided in the gaps between neighboring partial electrodes of the electrical zone device.

15. The multi-beam source of claim 1, wherein openings of the plurality of openings of the electrical zone device are present only within the areas of each of the partial electrodes of the electrical zone device.

16. The multi-beam source of claim 1, wherein a CMOS-layer is provided within the electrical zone device, containing electronic circuitry for controlling the partial electrodes of the electrical zone device by applying different electrostatic potentials.

17. The multi-beam source of claim 1, wherein the partial electrodes of the electrical zone device are controlled via direct wiring which is adapted to apply different electrostatic potentials to the partial electrodes.

18. The multi-beam source of claim 1, wherein said electrical zone device is at least one of said electrical zone devices.

19. The multi-beam source of claim 18, wherein at least one of said electrical zone devices is positioned immediately in front of or after a beam-splitting means as seen along the direction of the particle beam.

20. The multi-beam source of claim 18, wherein a first electrical zone device of the plurality of electrical zone devices is positioned immediately in front of the beam-splitting means as seen along the direction of the particle beam and a second electrical zone device is positioned immediately after the beam-splitting means as seen along the direction of the particle beam.

21. The multi-beam source of claim 20, wherein the partial electrodes of at least one of the plurality of electrical zone devices are arranged such that each opening of the plurality of openings of the electrical zone device is associated with a set of said partial electrodes being located adjoining to the respective opening.

22. The multi-beam source of claim 1, further comprising a blanking device for switching off the passage of selected beamlets, said blanking device having a substantially plate-like shape, comprising a plurality of openings, each opening being provided with at least one controllable deflection means for deflecting particles radiated through the opening off their nominal path.

23. The multi-beam source of claim 22, wherein the blanking device has a CMOS-layer for controlling the deflection means.

24. The multi-beam source of claim 1, further comprising at least one correction lens arrangement for the correction of geometric aberrations of the multi-beam source, the correction lens arrangement having a substantially plate-like shape and comprising a plurality of orifices, the orifices widening to opening spaces at the beginning or the end of the orifice as seen in the direction of the particle beam, said opening spaces configured to act as correction lenses upon receiving the respective beamlets, said opening spaces further having a width varying over the area of the correction lens arrangement, thus defining a varying correction lens strength, the correction lens arrangement being located in front of or after the electrical zone device as seen in the direction of the particle beam.

25. The multi-beam source of claim 24, wherein the correction lens arrangement is located adjacent to said electrical zone device, the electrical zone device being arranged in front of or after the correction lens arrangement as seen along the direction of the particle beam.

26. The multi-beam source of claim 1, wherein the electrical zone device is provided with a cover.

27. The multi-beam source of claim 26, wherein the cover layer is made of electrically conductive material.

28. An electrical zone device for use in a multi-beam source according to claim 1, said electrical zone device comprising a composite electrode having lateral dimensions covering the whole of the electrical zone device, said composite electrode being composed of a plurality of substantially planar partial electrodes, said partial electrodes being arranged adjoining to each other according to a partitioning of the surface area of the electrical zone device and said partial electrodes being adapted to be applied different electrostatic potentials, the electrical zone device further comprising a plurality of openings.

29. The electrical zone device of claim 28, wherein the partial electrodes of the electrical zone device are arranged such that each opening of the plurality of openings of the electrical zone device is associated with a set of partial electrodes being located adjoining to the respective opening.

30. The electrical zone device of claim 29, wherein the set of partial electrodes comprises four partial electrodes.

31. The electrical zone device of claim 28, wherein the partial electrodes are shaped as concentric rings.

32. The electrical zone device of claim 28, wherein the partial electrodes are shaped as sectors arranged around an optical axis of the electrical zone device.

33. The electrical zone device of claim 28, wherein the partial electrodes are sector-shaped and arranged around a central area of the electrical zone device, said central area being formed by at least one further central partial electrode.

34. The electrical zone device of claim 28, wherein a resistive material is provided in the gaps between neighboring partial electrodes.

35. The electrical zone device of claim 28, wherein openings of the plurality of openings of the electrical zone device are present only within the areas of each of the partial electrodes of the electrical zone device and not in the gaps between the partial electrodes.

36. The electrical zone device of claim 28, wherein a CMOS-layer is provided within the electrical zone device to allow for controlling the partial electrodes of the electrical zone device by applying different electrostatic potentials.

37. The electrical zone device of claim 28, wherein the partial electrodes are controlled via direct wiring which is adapted to apply different electrostatic potentials to the partial electrodes.

38. The electrical zone device of claim 28, further comprising a cover layer to protect subsequent structures of the electrical zone device.

39. The electrical zone device of claim 38, wherein the cover layer is made of electrically conductive material.

40. An apparatus for multi-beam lithography for irradiating a target by means of a beam of energetic electrically charged particles, comprising:
the multi-beam source of claim 1 for generating a plurality of substantially telecentric/parallel beamlets out of the beam of energetic electrically charged particles, and
a multi-beam optical system positioned after the multi-beam source as seen in the direction of the beam for focusing the beamlets onto the surface of the target.

41. The apparatus of claim 40, further comprising at least one blanking means for switching off the passage of selected beamlets, said blanking means having a plurality of openings, each opening corresponding to a respective aperture of the beam-splitting means of the multi-beam source, each opening being provided with a controllable deflection means for deflecting particles radiated through the opening off their path to an absorbing surface within the multi-beam lithography apparatus, said blanking means being located before the multi-beam optical system as seen in the direction of the particle beam and/or being integrated in the multi-beam optical system.

42. The apparatus of claim 40, wherein the multi-beam source has a blanking device having a substantially plate-like shape, comprising a plurality of openings, each opening being provided with at least one controllable deflection means for deflecting particles radiated through the opening off their nominal path.

43. The apparatus of claim 40, wherein for each beamlet a deflection unit is provided, said deflection unit being positioned within or before the multi-beam optical system as seen in the direction of the beam, said deflection unit being adapted to correct individual imaging aberrations of its respective beamlet with respect to a desired position on the target and/or to position its respective beamlet during a writing process on the target.

44. The apparatus of claim 40, wherein an electrostatic lens array is placed within the multi-beam optical system.

45. The apparatus of claim 40, wherein for each beamlet an electrostatic lens arrangement is provided as a means to adjust the diameter of the beamlet and/or the position of the beamlet on the target.

* * * * *